(12) United States Patent
Yim et al.

(10) Patent No.: US 7,884,460 B2
(45) Date of Patent: Feb. 8, 2011

(54) INTEGRATED CIRCUIT PACKAGING SYSTEM WITH CARRIER AND METHOD OF MANUFACTURE THEREOF

(75) Inventors: Choong Bin Yim, Seongnam-si (KR); Hyeog Chan Kwon, Seoul (KR); Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/360,644

(22) Filed: Jan. 27, 2009

(65) Prior Publication Data

US 2009/0134509 A1    May 28, 2009

Related U.S. Application Data

(63) Continuation of application No. 11/276,946, filed on Mar. 17, 2006, now Pat. No. 7,501,697.

(51) Int. Cl.
*H01L 23/02* (2006.01)
(52) U.S. Cl. .......................... 257/686; 257/777
(58) Field of Classification Search .............. 257/686, 257/777, 723, 724, 778, 787
See application file for complete search history.

(56) References Cited

U.S. PATENT DOCUMENTS

| | | | |
|---|---|---|---|
| 5,646,828 A | 7/1997 | Degani et al. | |
| 5,663,593 A | 9/1997 | Mostafazadeh et al. | |
| 6,005,778 A | 12/1999 | Spielberger et al. | |
| 6,861,288 B2 * | 3/2005 | Shim et al. | 438/109 |
| 6,906,416 B2 | 6/2005 | Karnezos | |
| 6,936,922 B1 | 8/2005 | Park et al. | |
| 6,939,740 B2 | 9/2005 | Yamaguchi | |
| 6,946,323 B1 | 9/2005 | Heo | |
| 6,965,160 B2 | 11/2005 | Cobbley et al. | |
| 6,967,395 B1 | 11/2005 | Glenn et al. | |
| 6,972,481 B2 | 12/2005 | Karnezos | |
| 7,718,472 B2 * | 5/2010 | Merilo et al. | 438/109 |
| 2006/0220209 A1 | 10/2006 | Karnezos et al. | |

FOREIGN PATENT DOCUMENTS

| JP | 08-250652 A | 9/1996 |
|---|---|---|
| JP | 2004-297071 A | 10/2004 |
| JP | 2005-285997 A | 10/2005 |

OTHER PUBLICATIONS

Office Action for Japanese Patent Application No. 54269/2007.

* cited by examiner

*Primary Examiner*—S. V Clark
(74) *Attorney, Agent, or Firm*—Mikio Ishimaru

(57) ABSTRACT

A method of manufacture of an integrated circuit packaging system includes: forming a carrier having a top side and a bottom side; forming an edge terminal pad on the top side and an inner terminal pad on the bottom side; connecting an integrated circuit die to an inner portion of the edge terminal pad; and encapsulating the integrated circuit die and the inner portion of the edge terminal pad with the outer portion of the edge terminal pad exposed.

8 Claims, 3 Drawing Sheets

INTEGRATED CIRCUIT PACKAGING SYSTEM WITH CARRIER AND METHOD OF MANUFACTURE THEREOF

CROSS-REFERENCE TO RELATED APPLICATION(S)

This application is a continuation of U.S. Non Provisional patent application Ser. No. 11/276,946 filed Mar. 17, 2006.

TECHNICAL FIELD

The present invention relates generally to integrated circuit packages and more particularly to integrated circuit package on package.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. The multi-chip module has achieved a prominent role in reducing the board space. Numerous package approaches stack multiple integrated circuit, package level stacking, or package-on-package (POP). Known-good-die KGD and assembly process yields are not an issue since each package can be tested prior to assembly, allowing KGD to be used in assembling the stack. But stacking integrated devices, package-on-package, or a combination thereof has system level difficulties. Package-on-package structure is used for decreasing the assembly yield loss of package and convenience of testing assembled product. However, its height has increased because it was composed of two ordinary packages.

Thus, a need still remains for the integrated circuit packaging system providing low cost manufacturing as well as flexibility for different stacking configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a carrier having a top side and a bottom side; forming an edge terminal pad on the top side and an inner terminal pad on the bottom side; connecting an integrated circuit die to an inner portion of the edge terminal pad; and encapsulating the integrated circuit die and the inner portion of the edge terminal pad with the outer portion of the edge terminal pad exposed.

The present invention provides an integrated circuit packaging system including: forming a carrier having a top side and a bottom side; forming a bond finger on the top side at the boundary of the top side; forming an inner terminal pad in a central portion on the bottom side; mounting an integrated circuit die to the top side; connecting the integrated circuit die to an inner portion of the bond finger; and encapsulating the integrated circuit die and the inner portion of the bond finger with the outer portion of the bond finger exposed.

Certain embodiments of the invention have other steps or elements in addition to or in place of those mentioned or obvious from the above. The steps or elements will become apparent to those skilled in the art from a reading of the following detailed description when taken with reference to the accompanying drawings.

BEST MODE FOR CARRYING OUT THE INVENTION

Figure 1:
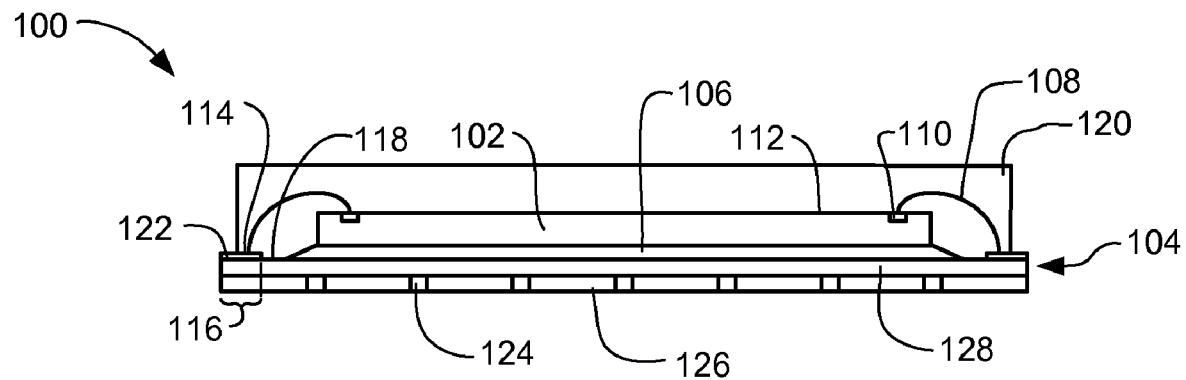
FIG. 1 is a cross-sectional view of a first integrated circuit packaging system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a first integrated circuit packaging system 100 in an embodiment of the present invention. The first integrated circuit packaging system 100 includes an integrated circuit die 102 attached on a carrier 104 with an adhesive 106. First electrical interconnects 108, such as bond wires, connect between bonding pads 110 on an active side 112 of the integrated circuit die 102 and inner portions 114 of first terminal pads 116, such as an edge terminal pad, at the boundary of a first side 118, such as top side, of the carrier 104.

A first encapsulation 120 forms a center gate mold and covers the integrated circuit die 102, the first electrical interconnects 108, and the inner portions 114 of the first terminal pads 116. The first encapsulation 120 leaves outer portions 122 of the first terminal pads 116 exposed for further electrical connections. A second side 124, such as a bottom side, of the carrier 104 has second terminal pads 126, such as an inner terminal pad, within a central region of the second side 124.

The carrier 104 may have connection structures (not shown) from the first side 118 and the second side 124 or between the first side 118 and the second side 124 separated by an insulation 128, such as a dielectric. Routing traces (not shown) may be on the first side 118, the second side 124, or between the first side 118 and the second side 124.

For illustrative purposes, the first side 118 is shown as having the first terminal pads 116 at the boundary, although it is understood that the first side 118 may have terminal pads at other locations. Also for illustrative purposes, the second side 124 is shown as having the second terminal pads 126 within the central region, although it is understood that the second side 124 may have terminal pads at other locations.

Figure 2:
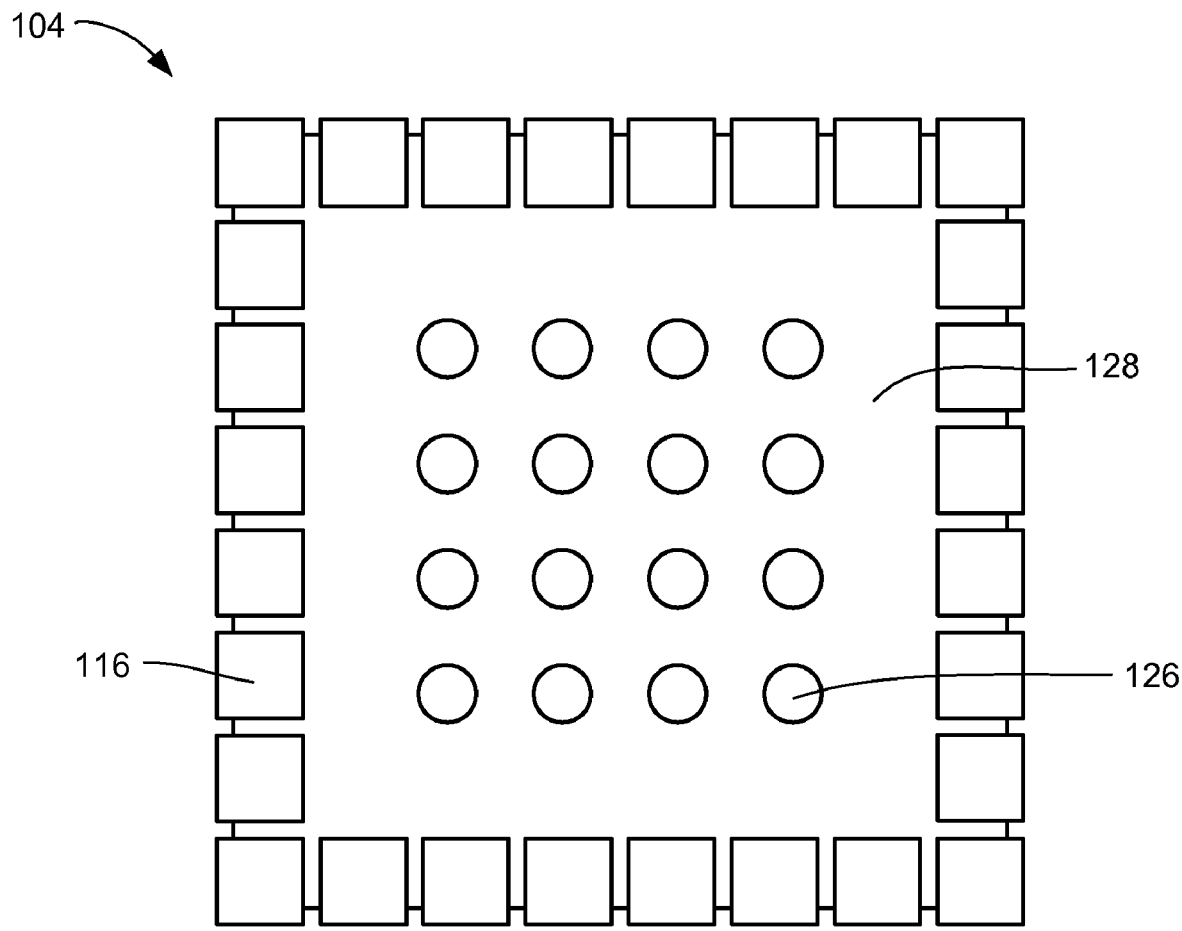
FIG. 2 is a plan view of the carrier.

Referring now to FIG. 2, therein is shown a plan view of the carrier 104. The plan view depicts the first terminal pads 116, such as bond fingers, at the boundary of the carrier 104. The second terminal pads 126 are in an array configuration within the carrier 104. The insulation 128 separates and isolates the first terminal pads 116 from each other in a predetermine configuration on the first side 118 of FIG. 1 and the second terminal pads 126 from each other also in a predetermine configuration on the second side 124 of FIG. 1. Both the first terminal pads 116 and the second terminal pads 126 may be used for further electrical connections.

Figure 3:
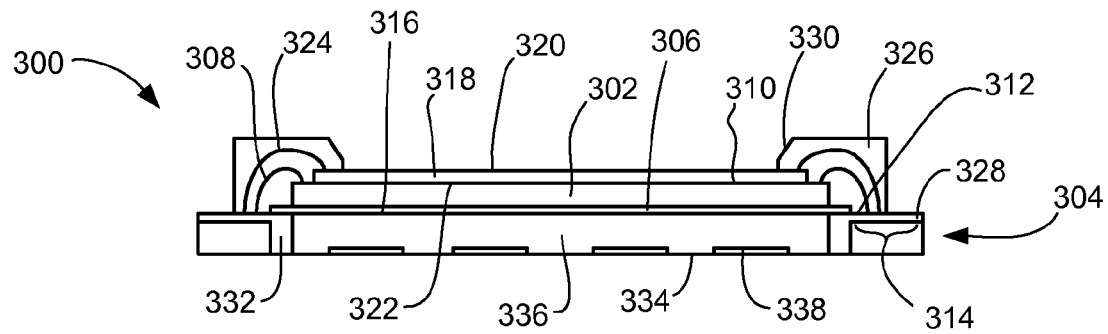
FIG. 3 is a cross-sectional view of a second integrated circuit packaging system in an alternative embodiment of the present invention.

Referring now to FIG. 3, therein is shown a cross-sectional view of a second integrated circuit packaging system 300 in an alternative embodiment of the present invention. The second integrated circuit packaging system 300 includes an integrated circuit die 302 attached on a carrier 304 with an adhesive 306. First interconnects 308, such as bond wires, connect between bonding pads (not shown) on an active side 310 of the integrated circuit die 302 and a predetermined instances of inner portions 312 of first terminal pads 314 at the boundary of a first side 316, such as top side, of the carrier 304.

An interposer 318 has a top side 320 and a bottom side 322. The interposer 318 is attached to the active side 310 without impeding connections of the first interconnects 308 to the integrated circuit die 302, wherein the bottom side 322 of the interposer 318 is attached to the active side 310. Second interconnects 324, such as bond wires, connect between a boundary of the top side 320 and a predetermined instances of the inner portions of the first terminal pads 314.

A first encapsulation 326 covers the integrated circuit die 302, the first interconnects 308, the second interconnects 324, and the inner portions 312 of the first terminal pads 314. The first encapsulation 326 exposes outer portions 328 of the first terminal pads 314 exposed for further electrical connections.

A recess 330 at the top of the first encapsulation 326 exposes a central portion of the interposer 318 while covering the boundary of the interposer 318.

The carrier 304 includes connection structures 332, such as electrical vias, from the first side 316 and a second side 334 or between the first side 316 and the second side 334 separated by an insulation 336. Routing traces (not shown) may be on the first side 316, the second side 334, or between the first side 316 and the second side 334.

For illustrative purposes, the first side 316 is shown as having the first terminal pads 314 at the boundary, although it is understood that the first side 316 may have terminal pads at other locations. Also for illustrative purposes, the second side 334 is shown as having the second terminal pads 338 within the central region, although it is understood that the second side 334 may have terminal pads at other locations.

Figure 4:
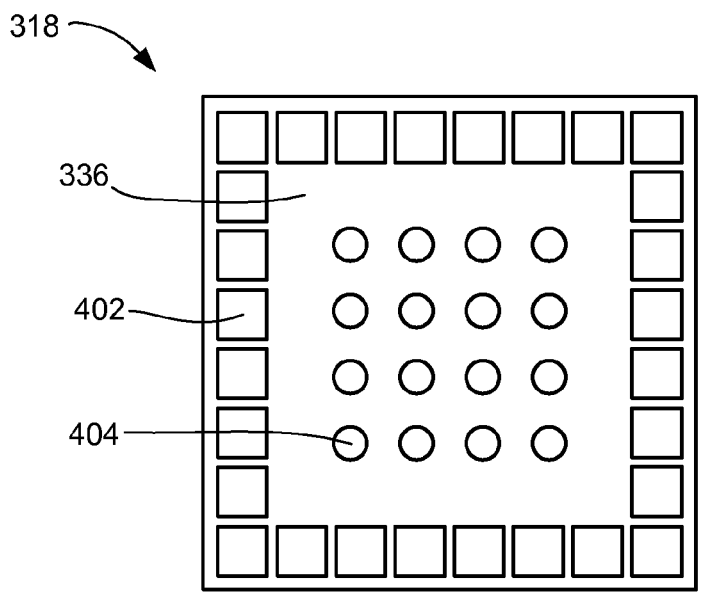
FIG. 4 is a top view of the interposer.

Referring now to FIG. 4, therein is shown a top view of the interposer 318, such as a glass epoxy laminate, a flexible circuit tape, a ceramic, or resin coated copper or metal alloy lead frame. The plan view depicts boundary terminal pads 402, such as bond fingers, at the boundary of the interposer 318. Interior terminal pads 404 are in an array configuration at an inner area the interposer 318. The insulation 336 separates and isolates the boundary terminal pads 402 from each other in a predetermine configuration and the interior terminal pads 404 from each other also in a predetermine configuration. Routing traces (not shown) may connect predetermined instances of the boundary terminal pads 402 and the interior terminal pads 404. Both the boundary terminal pads 402 and the interior terminal pads 404 may be used for further electrical connections.

Figure 5:
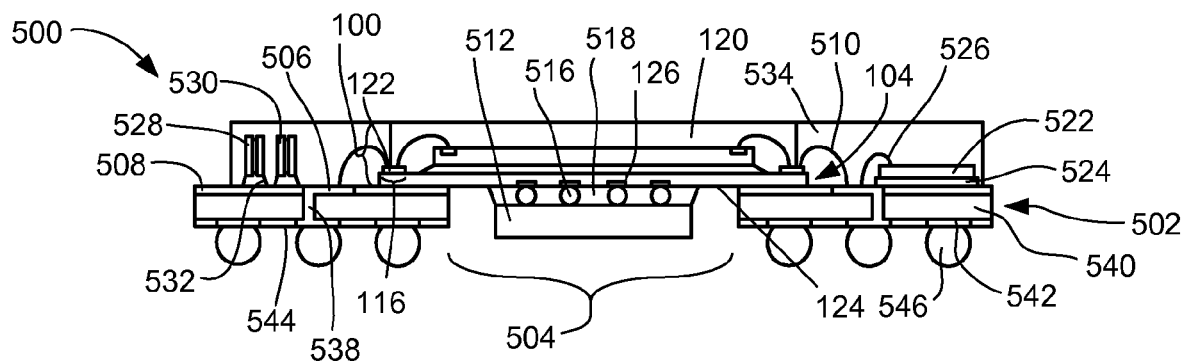
FIG. 5 is a cross-sectional view of a first integrated circuit package on package system having the first integrated circuit packaging system.

Referring now to FIG. 5, therein is shown a cross-sectional view of a first integrated circuit package on package system 500 having the first integrated circuit packaging system 100. The first integrated circuit packaging system 100 is on a substrate 502 and over a hole 504 of the substrate 502. The outer portions 122 of the first terminal pads 116 connect to predetermined locations of bond sites 506 on a top surface 508 of the substrate 502 with second interconnects 510, such as bond wires.

A first device 512, such as a bare integrated circuit die or a packaged integrated circuit die, that has been tested and determined to be a known good device (KGD) has an active side 514 with first device interconnects 516, such as solder bumps in an array configuration, thereon. The first device 512 is within the hole 504 of the substrate 502 and attach onto the second side 124 of the carrier 104. The first device interconnects 516 connect to the second terminal pads 126 of the carrier 104. The carrier 104 also functions as an interposer in this configuration. An underfill encapsulation 518 covers the active side 514 and the first device interconnects 516.

A second device 522, such as integrated circuit die, attaches on the top surface 508 with an adhesive 524. Third interconnects 526, such as bond wires, connect between the second device 522 and predetermined locations of the bond sites 506. A third device 528, such a small package component or a passive device, and a fourth device 530, such a small package component or a passive device, connect to the top surface 508 with fourth interconnects 532, such as solder bumps. It understood that the second device 522, the third device 528, and the fourth device 530 may be any active or passive known good devices. It is also understood that the first integrated circuit packaging system 100 may also be tested prior to assembly to ensure KGD.

A second encapsulation 534 covers the first integrated circuit packaging system 100, the second interconnects 510, the second device 522, the third interconnects 526, the third device 528, the fourth device 530, and the fourth interconnects 532 on the top surface 508. The second encapsulation 520 and the first encapsulation 120 of the first integrated circuit packaging system 100 form a hermetic seal.

The substrate 502 includes a top conductive layer, a bottom conductive layer, electrical vias 538, and an insulation 540, such as a dielectric. The top conductive layer provides the bond sites 506 and routing traces (not shown) at the top surface 508 of the substrate 502. The bottom conductive layer provides contact sites 542 and routing traces (not shown) at a bottom surface 544 of the substrate 502. The electrical vias 538 connects the top conductive layer and the bottom conductive layer in a predetermined configuration, such as between the bond sites 506 and the contact sites 542.

The insulation 540 separates the traces of the top conductive layer from each other, the traces of the bottom conductive layer from each other, the top conductive layer from the bottom conductive layer, and the electrical vias 538 from each other. External interconnects 546 attach to the contact sites 542 on the bottom surface 544 for connections to the next system level (not shown), such as a printed circuit board. The first device 512 does not prevent the external interconnects 546 attaching to the next system level.

Figure 6:
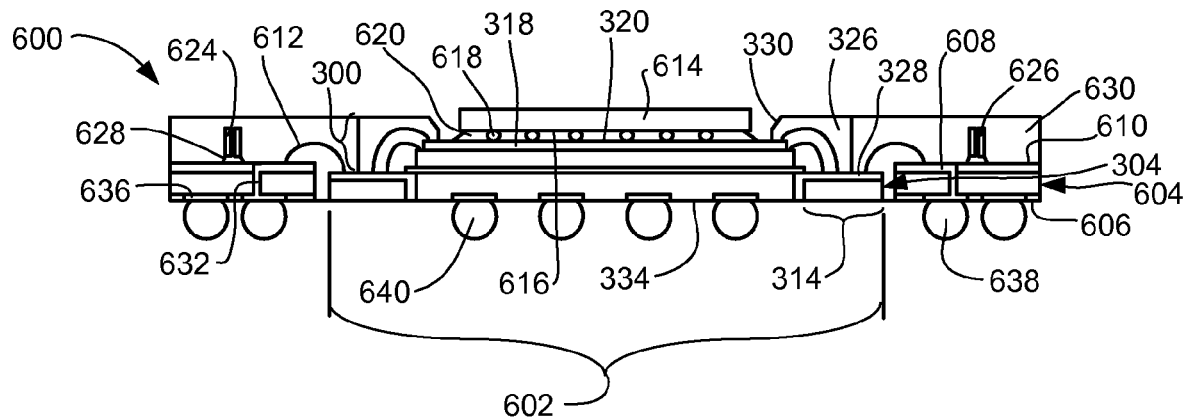
FIG. 6 is a cross-sectional view of a second integrated circuit package on package system having the second integrated circuit packaging system.

Referring now to FIG. 6, therein is shown a cross-sectional view of a second integrated circuit package on package system 600 having the second integrated circuit packaging system 300. The second integrated circuit packaging system 300 is in a hole 602 of a substrate 604. The second side 334 is substantially in the same horizontal plane as a bottom surface 606 of the substrate 604. The outer portions 328 of the first terminal pads 314 connect to predetermined locations of bond sites 608 on a top surface 610 of the substrate 604 with third interconnects 612, such as bond wires.

A first device 614, such as a bare integrated circuit die or a packaged integrated circuit die, that has been tested and determined to be a known good device (KGD) has an active side 616 with first device interconnects 618, such as solder bumps in an array configuration, thereon. The first device 614 is in the recess 330 of the first encapsulation 326 and attach onto the top side 320 of the interposer 318. The first device interconnects 618 connect to the interior terminal pads 404 of the interposer 318. An underfill encapsulation 620 covers the active side 616 and the first device interconnects 618.

A second device 624, such a small package component or a passive device, and a third device 626, such a small package component or a passive device, connect to the top surface 610 with fourth interconnects 628, such as solder bumps. It understood that the second device 624 and the third device 626 may be any active or passive known good devices. It is also understood that the second integrated circuit packaging system 300 may also be tested prior to assembly to ensure KGD.

A second encapsulation 630 covers the third interconnects 612, the second device 624, the third device 626, and the fourth interconnects 628 on the top surface 610. The second integrated circuit packaging system 300 is also covered by the second encapsulation 630 with the second side 334 and the recess 330 as well as the first device 614 exposed. The hole 602 is filled with the second encapsulation 630. The second encapsulation 630 and the first encapsulation 326 of the second integrated circuit packaging system 300 form a hermetic seal.

The substrate 604 includes a top conductive layer, a bottom conductive layer, electrical vias 632, and an insulation 634, such as a dielectric. The top conductive layer provides the bond sites 608 and routing traces (not shown) at the top surface 610 of the substrate 604. The bottom conductive layer provides contact sites 636 and routing traces (not shown) at the bottom surface 606 of the substrate 604. The electrical vias 632 connects the top conductive layer and the bottom conductive layer in a predetermined configuration, such as between the bond sites 608 and the contact sites 636. The insulation 634 separates the traces of the top conductive layer from each other, the traces of the bottom conductive layer from each other, the top conductive layer from the bottom conductive layer, and the electrical vias 632 from each other.

First external interconnects 638 attach to the contact sites 636 on the bottom surface 606 for connections to the next system level (not shown), such as a printed circuit board. Second external interconnects 640 attach to the interior terminal pads 404 of the carrier 304 also for connections to the next system level.

Figure 7:
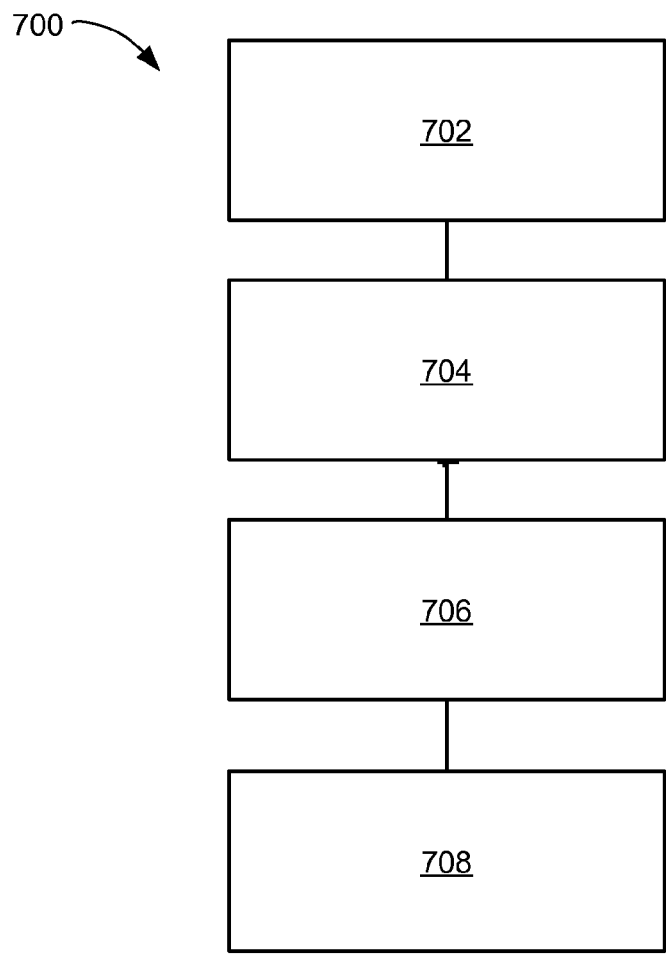
FIG. 7 is a flow chart of a method of manufacture of an integrated circuit packaging system in a further embodiment of the present invention.

Referring now to FIG. 7, therein is shown a flow chart of a method 700 of manufacture of an integrated circuit packaging system 100 in a further embodiment of the present invention. The method 700 includes forming a carrier having a top side and a bottom side in a block 702; forming an edge terminal pad on the top side and an inner terminal pad on the bottom side in a block 704; connecting an integrated circuit die to an inner portion of the edge terminal pad in a block 706; and encapsulating the integrated circuit die and the inner portion of the edge terminal pad with the outer portion of the edge terminal pad exposed in a block 708.

It has been discovered that the present invention thus has numerous aspects.

It has been discovered that the integrated circuit packaging system provides a flexible connections to the integrated circuit die in the integrated circuit packaging system. The external connections may be made with the top side or the bottom side of the carrier of the integrated circuit packaging system. The flexible connection options allow the integrated circuit packaging system to be tested before assembly into multichip or package on package configurations.

An aspect is that the present invention provides the encapsulation forming a center gate configuration and partially covering the terminal pads on the top side of the carrier of the integrated circuit package allowing connection options to the uncovered portions of the terminal pads on the top side. The covered portions of the terminal pads on the top side may be connected to the integrated circuit. External connections may be made to the integrated circuit die with connections to the terminal pads only, reducing the routing complexity of the carrier.

Another aspect of the present invention is terminal pads at the bottom side of the carrier of the integrated circuit packaging system. The bottom terminal pads may be used to connect to the integrated circuit die of the integrated circuit packaging system or mount other known good devices to the integrated circuit packaging system to form a package on package configuration.

Yet another aspect of the present invention is a package on package configuration may be formed by mounting a KGD in a recess on the interposer of the integrated circuit packaging system such that the height of the package on package configuration is not increased. The interposer and the carrier offer numerous connection options for the stacking device, the integrated circuit die of the integrated circuit packaging system, and other devices on the substrate of the package on package structure.

Yet another aspect of the present invention is a package on package configuration with a substrate having a hole. A KGD may be mounted on the bottom side the integrated circuit packaging system and in the hole such that the height of the package on package configuration is not increased.

Thus, it has been discovered that the integrated circuit packaging system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package in packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. An integrated circuit packaging system comprising:
   a carrier having a top side and a bottom side;
   an edge terminal pad on the top side and an inner terminal pad on the bottom side;
   an integrated circuit die connected to an inner portion of the edge terminal pad;
   a first encapsulation to cover the integrated circuit die and the inner portion of the edge terminal pad with the outer portion of the edge terminal pad exposed;
   a substrate having a hole;
   the integrated circuit packaging system on the substrate and over the hole;
   the outer portion of the edge terminal pad connected to the substrate;
   a second encapsulation to cover the integrated circuit packaging system on the substrate; and
   a device on the bottom side in the hole.

2. The system as claimed in claim 1 further comprising:
   an interposer having a boundary terminal pad and an interior terminal pad;
   the interposer on the integrated circuit die;
   the boundary terminal pad connected to the inner portion of the edge terminal pad; and
   the first encapsulation to cover the interposer with the interior terminal pad exposed.

3. The system as claimed in claim 1 further comprising:
   a first device on the substrate;
   a second encapsulation to cover the first device on the substrate.

4. The system as claimed in claim 1 wherein:
   the carrier having the top side and the bottom side has a bond site;
   the edge terminal pad on the top side is a bond finger and the inner terminal pad on the bottom side is in a central portion of the bottom side;
   the integrated circuit die connected to the inner portion of the edge terminal pad is mounted on the top side; and
   the first encapsulation to cover the integrated circuit die and the inner portion of the edge terminal pad with the outer portion of the edge terminal pad exposed.

5. The system as claimed in claim 4 further comprising:
   an interposer having a boundary terminal pad and an interior terminal pad;
   the interposer on the integrated circuit die;
   the boundary terminal pad connected to the inner portion of the bond finger;
   the first encapsulation to cover the interposer with the interior terminal pad exposed.

6. The system as claimed in claim 4 further comprising an array of inner terminal pads in the central portion on the bottom side.

7. The system as claimed in claim 4 further comprising:
   an interposer having a boundary terminal pad and an array of interior terminal pads;
   the interposer on the integrated circuit die;
   the boundary terminal pad connected to the inner portion of the bond finger; and
   the first encapsulation to cover the interposer with the interior terminal pads exposed.

8. The system as claimed in claim 4 further comprising an external interconnect attached to the inner terminal pad.

* * * * *